(12) United States Patent
Birdsong et al.

(10) Patent No.: US 11,509,327 B2
(45) Date of Patent: Nov. 22, 2022

(54) SYSTEM AND METHOD TO ENHANCE NOISE PERFORMANCE IN A DELTA SIGMA CONVERTER

(71) Applicant: Analog Devices, Inc., Wilmington, MA (US)

(72) Inventors: Preston S. Birdsong, Medfield, MA (US); Abhishek Bandyopadhyay, Winchester, MA (US); Adam R. Spirer, Westwood, MA (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 17/396,014

(22) Filed: Aug. 6, 2021

(65) Prior Publication Data

US 2022/0045692 A1 Feb. 10, 2022

Related U.S. Application Data

(60) Provisional application No. 63/063,546, filed on Aug. 10, 2020.

(51) Int. Cl.
*H03M 7/32* (2006.01)
*H03M 7/36* (2006.01)
*H03M 3/00* (2006.01)

(52) U.S. Cl.
CPC ......... *H03M 7/3011* (2013.01); *H03M 3/368* (2013.01); *H03M 3/412* (2013.01); *H03M 7/3017* (2013.01); *H03M 7/3022* (2013.01); *H03M 7/3042* (2013.01)

(58) Field of Classification Search
CPC ............ H03M 7/3011; H03M 7/3017; H03M 7/3022; H03M 7/3042; H03M 3/368; H03M 3/412; H03M 3/444; H03M 3/502
See application file for complete search history.

(56) References Cited

U.S. PATENT DOCUMENTS

| | | | |
|---|---|---|---|
| 6,873,218 B2 | 3/2005 | Khlat | |
| 6,940,436 B2 | 9/2005 | Hezar et al. | |
| 7,079,063 B1 | 7/2006 | Nguyen et al. | |
| 7,277,035 B1 | 10/2007 | You et al. | |
| 8,554,159 B2 | 10/2013 | Van Waasen et al. | |
| 8,643,525 B1 * | 2/2014 | Wen ...................... | H03M 1/067 375/252 |
| 8,953,813 B2 | 2/2015 | Loeda | |
| 9,137,600 B2 | 9/2015 | Hetherington et al. | |

(Continued)

OTHER PUBLICATIONS

Adams et al., *A 113-dB SNR Oversampling DAC with Segmented Noise-Shaped Scrambling*, IEEE Journal of Solid-State Circuits, vol. 33, No. 12, Dec. 1998, 8 pages.

(Continued)

*Primary Examiner* — Lam T Mai
(74) *Attorney, Agent, or Firm* — Akona IP PC

(57) ABSTRACT

Systems and methods for a power-efficient 3-level digital-to-analog converter. A converter cell using a current starving technique keeps a portion of the converter cell turned on in a low power mode, as opposed to completely turning off current in selected modes. A conversion system keeps a first set of converters active while allowing a second set of converters to be powered down. Systems and methods presented save power and allow for efficient reactivation of converters.

20 Claims, 12 Drawing Sheets

(56) References Cited

U.S. PATENT DOCUMENTS

| | | |
|---|---|---|
| 9,178,529 B2 | 11/2015 | Dong et al. |
| 9,397,676 B1 | 7/2016 | Nguyen et al. |
| 9,559,719 B1* | 1/2017 | Kauffman ............... H03M 3/30 |
| 9,735,799 B1 | 8/2017 | Nguyen |
| 9,768,800 B1 | 9/2017 | Nguyen |
| 9,955,250 B2 | 4/2018 | Hendrix et al. |
| 10,026,388 B2 | 7/2018 | Lu et al. |
| 10,110,242 B2 | 10/2018 | Liu |
| 2010/0149012 A1 | 6/2010 | Nguyen et al. |
| 2010/0328119 A1* | 12/2010 | Kobayashi .......... H03M 1/0607 |
| | | 341/110 |
| 2011/0273317 A1* | 11/2011 | Nagatani ............... H03M 1/662 |
| | | 327/432 |
| 2014/0145867 A1* | 5/2014 | Bandyopadhyay ... H03M 1/664 |
| | | 327/437 |
| 2014/0240154 A1* | 8/2014 | Kim .................... H03M 7/3022 |
| | | 341/143 |
| 2014/0375488 A1* | 12/2014 | Stoops .................... H03M 3/50 |
| | | 341/143 |
| 2015/0002322 A1* | 1/2015 | Bandyopadhyay .. H03K 17/063 |
| | | 341/118 |
| 2015/0171891 A1 | 6/2015 | Stoops et al. |
| 2016/0072515 A1 | 3/2016 | Kinyua |
| 2018/0145697 A1* | 5/2018 | Crespi .................... G06F 3/165 |
| 2018/0229748 A1 | 8/2018 | Nakamura et al. |
| 2019/0334545 A1* | 10/2019 | Quiquempoix ....... H03M 3/464 |

OTHER PUBLICATIONS

Bandyopadhyay et al., *A 120dB SNR 100dB THD+N 21.5mW/channel multibit CT ΔΣ DAC*, ISSCC Dig. Tech. Papers, pp. 482-483, Feb. 2011.

* cited by examiner

SYSTEM AND METHOD TO ENHANCE NOISE PERFORMANCE IN A DELTA SIGMA CONVERTER

CROSS REFERENCE TO RELATED APPLICATIONS

This application is related to and claims the benefit of priority under 35 U.S.C. § 119(e) to U.S. Provisional Patent Application No. 63/063,546 entitled "System and Method to Enhance Noise Performance in a Delta Sigma Converter" filed on Aug. 10, 2020, which is hereby incorporated by reference in its entirety. This application is also related to concurrently-filed application titled "System and Method to Enhance Noise Performance in a Delta Sigma Converter" which Application is incorporated herein by reference in its entirety into the disclosure of this application.

FIELD OF THE DISCLOSURE

The present invention relates to converters, and more specifically, to delta sigma converters.

BACKGROUND

Devices, such as class AB drivers, modulators, converters, and amplifiers, can be used in audio devices such as speakers and headphone drivers. Most of these applications are battery driven, and thus power consumption is an important parameter. These devices also need to meet high performance in terms of signal-to-noise ratio (SNR) and total harmonic distortion (THD). Typically, these applications have different modes of operation, such that one mode can be performance optimized and another can be power consumption optimized.

SUMMARY

Systems and method are provided for improving noise efficiency in a Delta Sigma modulator. A bypass scheme is disclosed that reduces toggling activity for small signals.

According to one aspect, a 3-level digital-to-analog converter (DAC) comprises a plurality of current sources each having a current flow, wherein the plurality of current sources includes a first subset of current sources and a second subset of current sources; a first positive current path for the first subset of current sources, wherein the first positive current path includes a first switch; a first negative current path for the first subset of current sources, wherein the first positive current path includes a second switch; a zero-state current path for a first portion of the first subset of current sources, wherein the zero-state current path is a dump path, and wherein the zero-state current path includes a third switch; and a bypass current path for a second portion of the first subset of current sources, wherein the zero-state current path includes a fourth switch, wherein the fourth switch is closed when the third switch is closed, and wherein the bypass current path is configured to shunt the second portion of current sources from the dump path, thereby keeping the DAC powered on.

According to another aspect, a system for converting a digital signal to an analog signal comprises an input signal; a first plurality of digital-to-analog converter (DAC) cells coupled to the input signal, wherein the first plurality of DAC cells remain powered on; a second plurality of DAC cells, wherein ones of the second plurality of DAC cells are configured to be powered down when the input signal is below a selected threshold; a charge amplifier configured to provide charge to powered down DAC cells of the second plurality of DAC cells; and a multiplexor, coupled to the charge amplifier and the second plurality of DAC cells, wherein, when the input signal rises above the selected threshold, the multiplexor is configured to connect the charge amplifier charge to powered down DAC cells of the second plurality of DAC cells, wherein the charge amplifier charge powers up the powered down DAC cells of the second plurality of DAC cells.

The drawings show exemplary digital Class D driver circuits and configurations. Variations of these circuits, for example, changing the positions of, adding, or removing certain elements from the circuits are not beyond the scope of the present invention. The illustrated playback circuits, configurations, and complementary devices are intended to be complementary to the support found in the detailed description.

This overview is intended to provide an overview of subject matter of the present patent application. It is not intended to provide an exclusive or exhaustive explanation of the invention. Further limitations and disadvantages of conventional and traditional approaches will become apparent to one of skill in the art, through comparison of such systems with some aspects of the present invention as set forth in the remainder of the present application with reference to the drawings.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

For a fuller understanding of the nature and advantages of the present invention, reference is made to the following detailed description of preferred embodiments and in connection with the accompanying drawings, in which.

DETAILED DESCRIPTION

Systems and method are provided for improving noise efficiency in a Delta Sigma modulator. A bypass scheme is disclosed that reduces toggling activity for small signals. Additionally, systems and methods for a Delta-Sigma modulator are provided including introducing a new DAC cell that can be turned off when not in use, thereby improving power efficiency.

Figure 1:
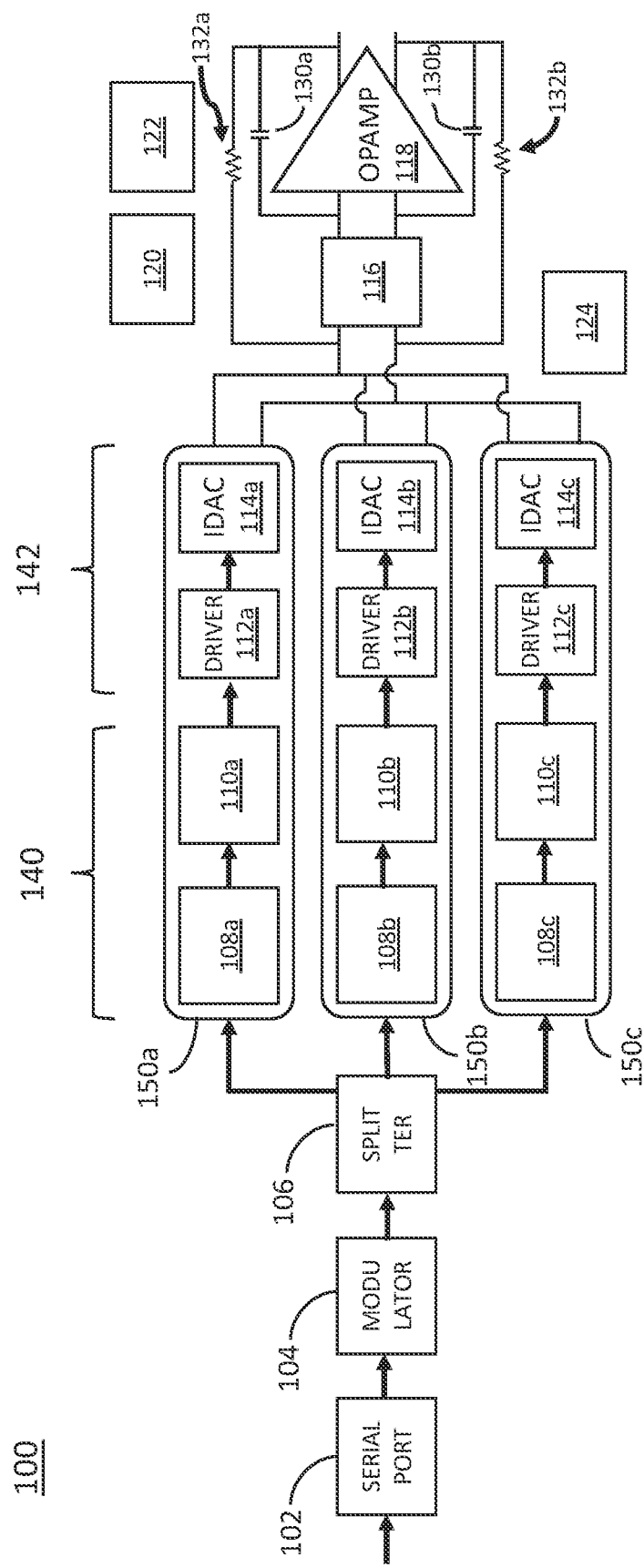
FIG. 1 depicts a system architecture for a continuous time (CT) digital to analog converter (DAC) playback path, according to various embodiments of the disclosure.

FIG. 1 depicts a system architecture 100 for a continuous time (CT) digital to analog converter (DAC) playback path, according to various embodiments of the disclosure. In some examples, the CT DAC playback path is an audio playback path. The playback path system architecture 100 includes a serial port and interpolator 102, a modulator 104, and a noise-shaping splitter 106. A digital input signal is input to the serial port and interpolator 102. In various examples, the input signal includes multiple samples and bus widths. In one example, the input signal includes 24 bit input. The input signal is interpolated and input to the modulator 104. In some examples, the interpolation filter uses canonical signed digit arithmetic, and thus has low power consumption. In some examples, the modulator 104 is a second order modulator. In some examples, the modulator 104 is an eight bit modulator. The modulator output is input to the noise-shaping splitter 106. The noise shaping splitter 106 splits the signal into three parallel processing lines, and outputs a first sample set to a first line 150a, a second sample set to a second line 150b, and a third sample set to a third line 150c. In some examples, the noise shaping splitter 106 splits the signal into the three sample sets, and each of the first, second, and third sample sets has a different gain. In one example, the first sample set has a gain of 1×, the second sample set has a gain of 4×, and the third sample set has a gain of 16×. Splitting the signal at the noise shaping splitter reduces the number of elements and the overall area of the CT DAC playback path.

Each of the first 150a, second 150b, and third 150c parallel processing lines includes a sign-magnitude conversion element 108a, 108b, 108c, a rotational scrambler 110a, 110b, 110c, an I-DAC driver 112a, 112b, 112c, and an I-DAC 114a, 114b, 114c. In some examples, the I-DACs 114a, 114b, 114c are 2-level I-DACs, and in some examples, the I-DACs 114a, 114b, 114c are 3-level DACs. Note that the signal is a digital signal through to the rotational scrambler (section 140), which outputs a digital signal to the I-DAC driver 112a, 112b, 112c. The I-DACs 114a, 114b, 114c are current DACs, and, according to various implementations, are power efficient DACs as described with respect to FIG. 2 below.

According to various implementations, the audio playback path 100 depicts a 1st-order noise shaped segmentation technique. In some examples, the sign-magnitude conversion elements 108a, 108b, 108c perform sign magnitude thermometer code conversion. Following the conversion elements 108a, 108b, 108c, the one or more of the scramblers 110a, 110b, 110c apply individual discrete element modeling to the signals in one or more of the respective parallel processing lines 150a, 150b, 150c. In various implementations, the discrete element model (DEM) is rotational in nature. In some examples, the DEM is first order DEM, and in some examples, the DEM is higher order DEM such as second order DEM, third order DEM, or higher. In some examples, the CT DAC of FIG. 1 is part of an audio playback path including headphone and/or speaker drivers.

The outputs from the first 150a, second 150b, and third 150c parallel processing lines are input to ISI free switching element 116. The outputs are also connected to parallel resistors 132a, 132b connected to the playback line 100 output. The switching element 116 output is input to an operational amplifier 118. On the right, the operational amplifier 118 and the resistors 132a, 132b dominate the noise contributions following the first 150a, second 150b, and third 150c parallel lines. The audio playback path 100 also includes an I-DAC bias generator 120, a bandgap element 122, and an ISI free clock generation 124. According to various implementations, the playback path 100 includes one or more elements described herein. The operational amplifier 118 and resistors 132a and 132b constitute a current to voltage converter which translate the overall current (provided by the current cells in the IDACs 214a, 214b, 241c,) to an output voltage. In some examples, the operational amplifier 118 is a class AB operational amplifier. In some examples, the operational amplifier 118 is a class D operational amplifier.

According to various implementations, the system shown in FIG. 1 includes a 1st-order noise shaped segmentation technique. In some examples, after a sign magnitude thermometer code conversion, individual rotational DEM is applied to each of the segmented data. The rotational DEM takes a mismatch for each of the current cells and does some shaping on it. Systems and methods are provided herein for improving the noise shaping splitter.

In traditional noise splitting modules, the bits received at the input line are split into two groups, decreasing the number of elements used. For example, an input signal of 6 bits is split into a 3 bit signal and a 4 bit signal, and the elements used decrease from $2^6$ to $2^3+2^4$. The noise splitting module shown in FIG. 1 shows a signal split into three parallel lines. For example, an 8-bit signal is split into three three-bit signals. In some examples, a first one of the parallel lines is a 1× current line, a second one of the parallel lines is a 4× current line, and a third one of the parallel lines is a 16× current line. The noise splitting module removes any gain mismatch between the parallel lines.

According to various implementations, systems and methods disclosed herein include a noise splitting module with two splits. In some examples, an 8 bit input signal is split into a 6-bit signal and a 3-bit signal. The 8 bit signal becomes a 9 bit signal upon splitting because of redundancy.

DAC Dynamic Power Mode

Figure 2:
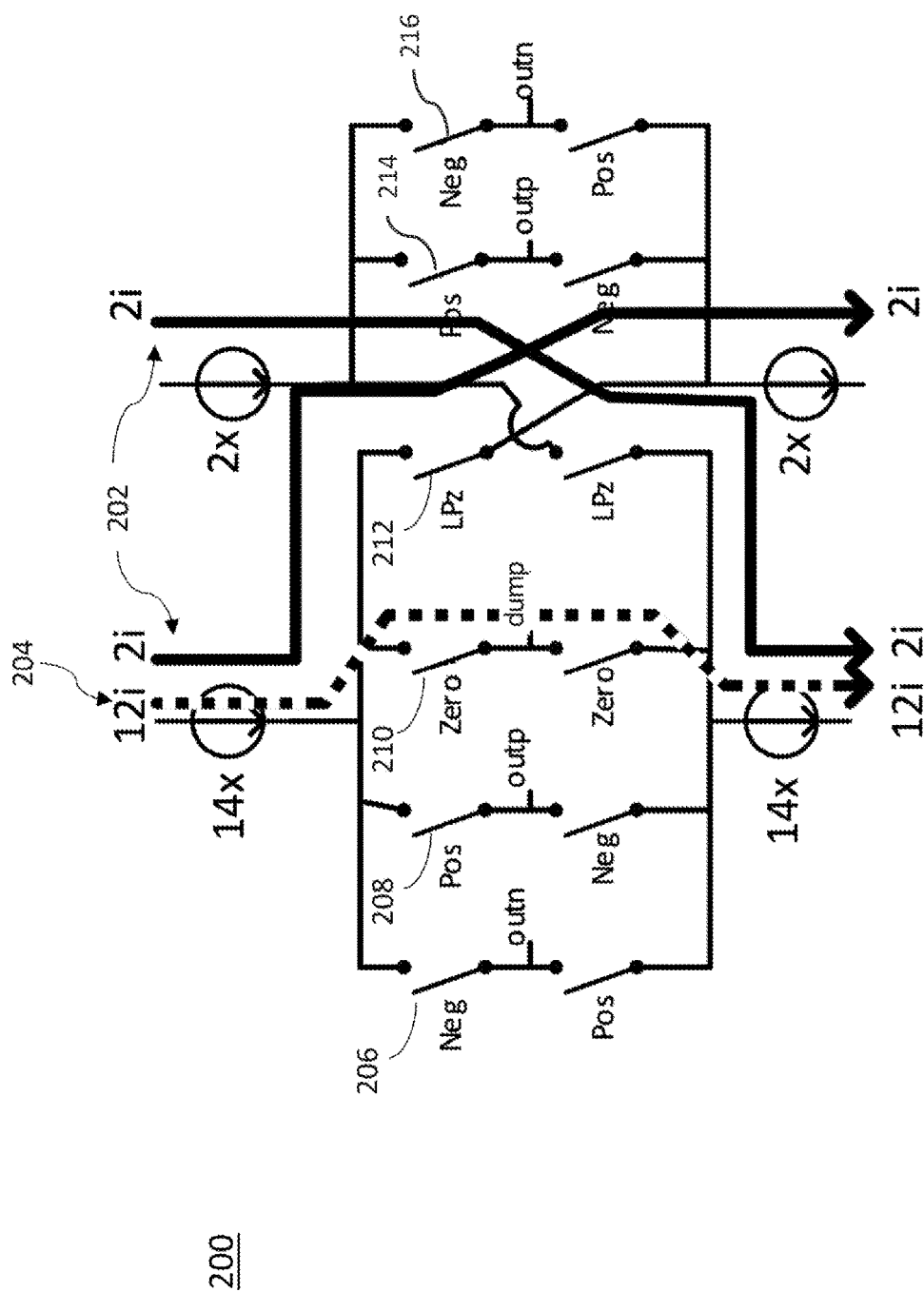
FIG. 2 shows an I-DAC cell using a current starving technique, according to various embodiments of the disclosure.

FIG. 2 shows an I-DAC cell 200 using a current starving technique, according to various embodiments of the disclosure. The current starving techniques involve keeping a portion of the I-DAC cell 200 turned on at all times, as opposed to completely turning off current through the cell in selected modes.

According to various implementations, there are several methods for reducing the power in a current cell. One way to reduce power is to disconnect the rails, which is not an efficient method. Another way to reduce power is to disconnect the cascodes, but this is also not an efficient method. A better method for reducing power is to deactivate the zero path switches. Provided herein is a more efficient method for reducing power which involves starving the current sources of current, as described below with respect to FIG. 2.

For a 4-bit MSB segment, there is a gain of 16 per MSB, and the I-DAC cell 200 has 16 times the current sources of the 1× LSB cell. Thus, in one example, in normal mode, the I-DAC cell 200 has a 16× current flow. In some examples, in power savings mode, the I-DAC cell 200 has a 4× current flow. Thus, in power savings mode, a first portion of the I-DAC cell 200 remains powered on but current starved. Additionally, since it can take time to charge up a capacitor once it has been turned off, leaving a portion of the DAC cells on allows the DAC to be used while the additional cells are restarted. One advantage of the I-DAC cell 200 is that no new devices are used to add the power savings mode. The power savings mode is included through rewiring within the cell.

The bold solid lines 202 and the dashed bold line 204 show the path of incoming current in normal operation. In full power mode, the 12$i$ current represented by the dashed bold line follows either the Neg 206, the Pos 208, or the zero 210 switch current path lines. In particular, the 16 current sources are split into a 14× current (which is split into 12× and 2×) on the left, and a 2× current on the right. In full power mode, the 14× current proceeds through the I-DAC cell 200 to either the Neg 206, the Pos 208, or the zero 210 switch current path lines. Additionally, in full power mode the 2× current flows through one of the LPz 212, the Pos 214, or the Neg 216 current path lines, which, combined with the 14× current flow, equal the desired 16× current. The Neg 206 and Neg 216 current path line corresponds to a −1 path for a 3-level DAC, while the Pos 208 and Pos 214 current path line corresponds to a +1 path for a 3-level DAC. The zero state (0-path) for a 3-level DAC is the zero 210 and LPz 212 current path line, or the dump line. The zero state is generally used to short the top current source to the bottom current source when a I-DAC cell is not in use. However, when an I-DAC is powered down, it can take a substantial amount of time to restart the I-DAC.

The power savings mode is illustrated by the solid bold lines 202 in FIG. 2. As illustrated by the dashed bold line 204, in the zero state (0-path) of the I-DAC 200, the 12× current does not have a current flow path when switch Zero 210 is open. However, 2× of the 14× input current is shunted to the LPz 212 switch current path line, and thus, the I-DAC cell 200 continues to run and is kept alive despite the majority of the I-DAC cell 200 powering down. This allows for significant power savings while also enabling the I-DAC cell 200 to power up quickly upon restart.

Thus, the I-DAC cell 200 is typically a 16× DAC, split into 14× and 2×. In power savings mode, 4× is used to keep the I-DAC cell 200 alive. Additionally, in the power savings mode, the 4× sources can be used to perform operations on a small signal that can be represented by a small current, while still saving 12× current sources. The ratios are specific to this example and different ratios can be used.

Figure 3A:
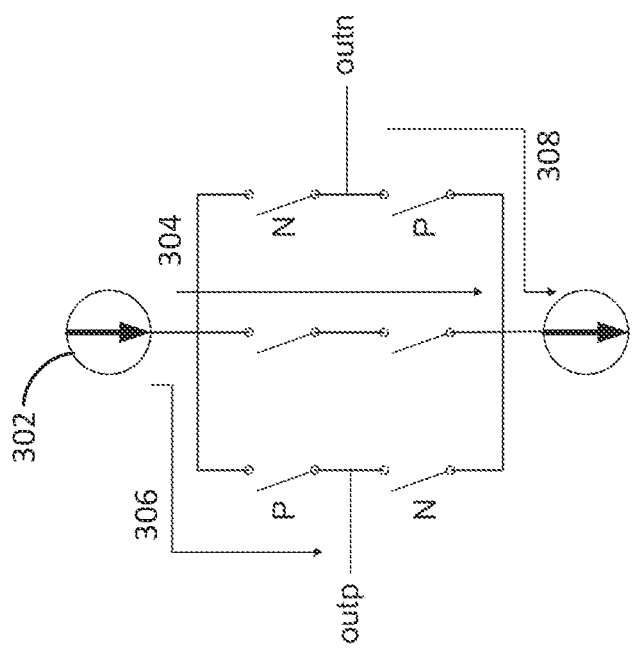
FIGS. 3A and 3B illustrate a traditional 3-level I-DAC with a current source 302 and having current flow in three potential states, according to various embodiments of the disclosure.
Figure 3B:
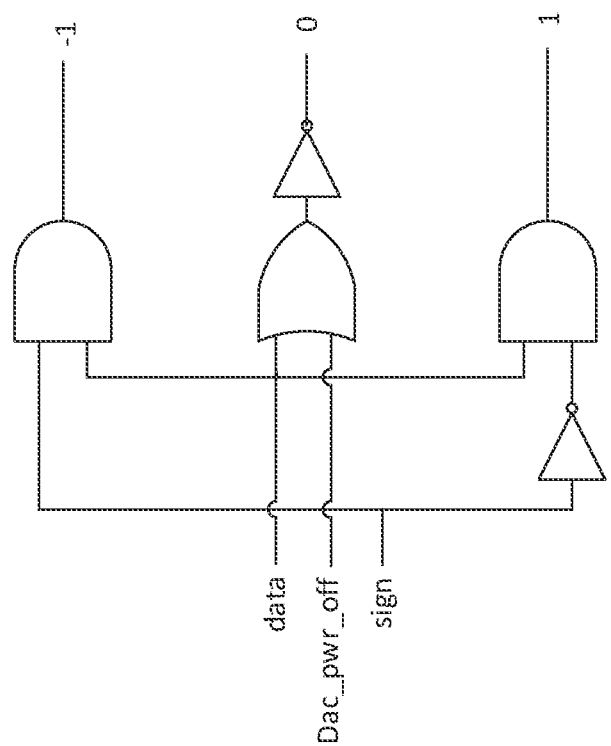

FIGS. 3A-3B illustrate a traditional 3-level I-DAC 300 with a current source 302 and having current flow in three potential states, according to various embodiments. In particular, the zero path 304 in the middle of the 3-level I-DAC 300 can be deactivated to reduce power. As shown in FIG. 3B, simple logic is used for I-DAC cell 300 switch decision. In particular, the addition of the pwr_off NOR allows all switches to be open eliminating any current path. In this mode, if the two cascodes are not chosen, the cascodes can turn off, thereby turning off the path from ground. The amplifiers generate gate voltages for the switches. In zero state and low power mode, the two z-switches can be opened, causing the I-DAC 300 to power down. In some examples, the same timing sequence can be used for reenabling the cells.

In some examples, in a first state, the plus one (+1) state, the PMOS current is flowing to outp, and simultaneously, the NMOS current is flowing from outn through the NMOS to ground. In a second state, the minus one (−1) state, the current from outp is flowing to the NMOS when the N switches are closed, and the PMOS current is flowing to outn. In a third state, the zero state, the Z switches are closed and the PMOS is shorted to the NMOS down to ground. When the I-DAC cell 300 is not in use, it is in the zero state, and the current cell is not contributing any current to outp or outn. Thus, the I-DAC cell 300 in the zero state is power efficient and has low noise, but it is wasting current down to ground. In the zero state, when the I-DAC cell 300 is turned off, it takes a long time to turn on. In contrast, the I-DAC cell 200 shown in FIG. 2 can be quickly switched on as needed.

Figure 4A:
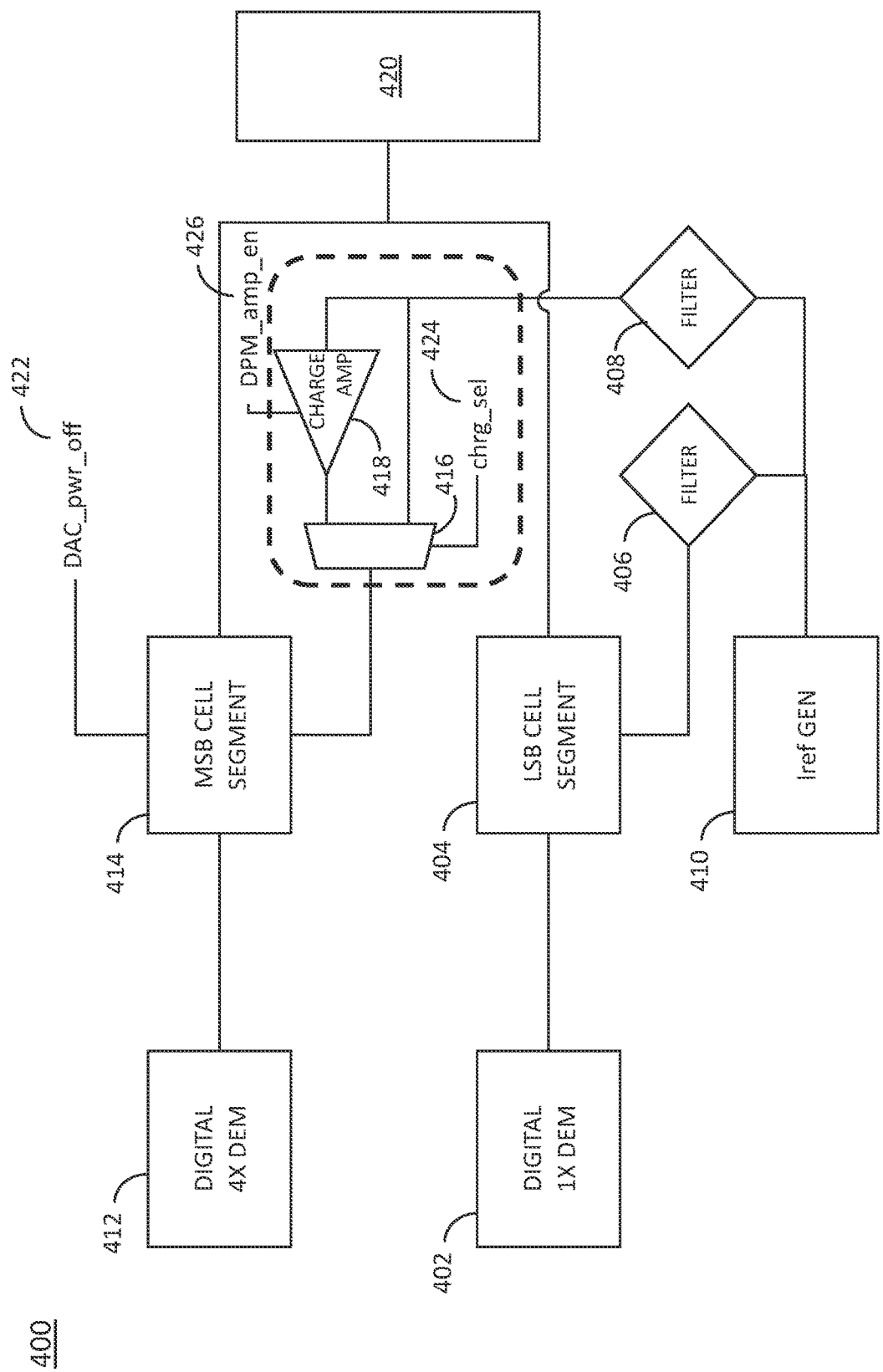
FIGS. 4A-4C show a simplified DAC structure for DAC Dynamic Power (DDP) operation and related timing diagrams, according to various embodiments of the disclosure.

FIG. 4A shows a simplified DAC structure 400 for DAC Dynamic Power (DDP) operation, according to various embodiments of the disclosure. The DAC 400 includes multiple DAC cells, most of which are turned off while some remain on. In various implementations, the DAC cells are I-DAC cells. In various examples, current can be turned off by opening up switches so no current flows along a line (see, e.g., FIGS. 2, 3A). However, when switches are subsequently closed to reinitiate current flow, there is a latency before reinitialization. The DAC 400 includes a digital 1× DEM module 402, a least significant bit (LSB) cell segment module 404, a first filter 406, a second filter 408, and a current source generator 410 (iref gen). The current source generator 410 generates voltages for IDAC cells in the LSB cell segment module 404. The DAC 400 further includes a digital 4× DEM module 412, a most significant bit (MSB) cell segment module 414, a multiplexor 416, a charge amplifier 426, and an output module 420. In some examples, the current source generator 410 generates voltages for IDAC cells in the MSB cell segment module 414. In some examples, the LSB cell segment module 404 includes 4, 6, or 8 DAC cells. In some examples, the MSB cell segment module 414 includes 32 DAC cells. In other examples, the LSB cell segment module 404 and MSB cell segment module 414 can include any selected number of cells. In general, the MSB cell segment module 414 includes more DAC cells than the LSB cell segment module 404.

As shown in FIG. 4A, there are two DEM modules: first DEM module 402 and second DEM module 412. The first DEM module 402 is connected to the LSB cell segment module 404, and the second DEM module 404 is connected to the MSB cell segment module 414. The DAC Dynamic Power system turns off and on the MSB cells in the MSB cell segment module 414 using the DAC_pwr_off signal 422, while the LSB cells in the LSB cell segment module 404 remain on. In various examples, within the MSB cell segment module 414, all or none of the MSB cells can be on. In some examples, a first portion of the MSB cells in the MSB cell segment module 414 are on, while the remaining portion of the MSB cells are off. When some MSB cells are on, the MSB cells that are on can be used at a moment's notice without any power-on latency. Turning off selected MSB cells can result in a significant power savings.

As shown in FIG. 4A, a dashed line is drawn around the multiplexor 416 and the charge amplifier 418. In normal operation, the multiplexor 416 selects the path and filters the bias straight into the DAC cells in the MSB cell segment module 414. When performing a switching operation (e.g., turning DAC cells on or off, or turning current sources on or off), the charge amplifier 418 is briefly turned on for the operation, and the charge amplifier 418 helps charge the gates for the large capacitances associated with the DAC cells so that the DAC cells can quickly charge. In some examples, the DAC cells quickly charge and power on. In some examples, the DAC cells handle charge when powered off such that other cells are not disrupted.

Once the operation is done, and a DAC cell is turned on, the multiplexor 416 switches back to the filter 408 and the charge amplifier 418 is disabled. Typically, the filters 406 and 408 do not provide much current, so the multiplexor switches over to the charge amplifier 418 to get extra charge/current, and then switches back to the line connected to the filter 408. In this way, the charge amplifier 418 is only connected to the DAC cell when it is needed so the amplifier 418 itself does not contribute noise to the system. Thus, the charge amplifier 418 is switched in to handle bias dynamics caused by DAC cells turning on or off. This isolates the disturbance from cells that are still active. Furthermore, because the amplifier 418 is only briefly connected to DAC cells and the cells the amplifier is driving are in a zero state, any noise requirement is removed from the amplifier 418.

Figure 4B:
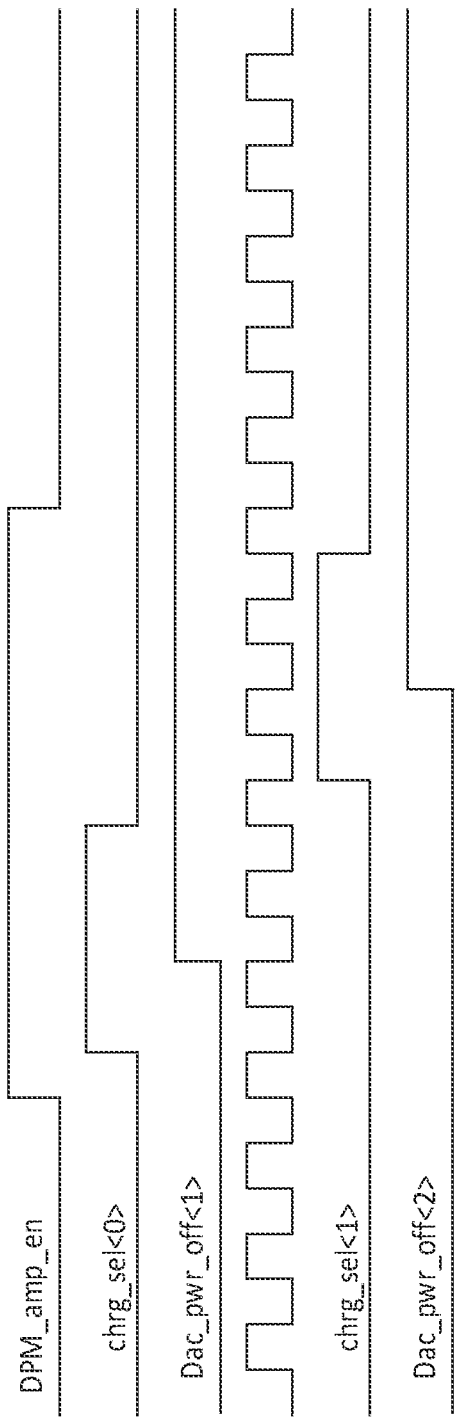

According to some implementations, there is a delay in the system such that when a signal is arriving and cells in the MSB cell segment module 414 will be powered on, the amplifier 418 is enabled. Referring to FIG. 4B, DPM_amp_en 426 is the input to the amplifier 418, and DPM_amp_en 426 is turned on to enable the amplifier 418. Then, the chrg_sel input signal chrg_sel<0> is switched on for a first signal (<0>) such that the multiplexor 416 switches bias lines to the charge amplifier 418 line. The DAC_pwr_off signal 422 is input to the MSB cell segment module 414, and the DAC_pwr_off<1> signal is switched on to turn on the current sources to DAC cells in the MSB cell segment module 414 that will be used for a next incoming signal (<1>). Then, the chrg_sel input signal chrg_sel<1> is switched on for the next signal (<1>) such that the DPM_amp_en remains activated and the multiplexor 416 remains on the charge amplifier 418 line. Thus, the charge amplifier 418 can remain connected through the multiplexor 416 for sequential operations. Following the next incoming signal (<1>), the DPM_amp_en is deactivated and the multiplexor 416 switches back to the bias line to the filter 408.

The outputs from the LSB cell segment module 404 and the MSB cell segment module 414 are input to an output 420. In some examples, the output 420 is a modulator, and it may be a class D modulator. In some examples, the output 420 is a class AB output. In some examples, the output 420 is a headphone app or a speaker.

According to various examples, the iref generator 410 includes a fixed bandgap voltage, and the iref generator 410 generates bias voltages from a voltage reference, in some examples, such as a fixed bandgap voltage. The output bias voltages from the iref generator 410 are used to bias and control the output current from the DAC cells of the LSB cell segment module 404 and the DAC cells of the MSB cell segment module 414. In some examples, when the input signal is above a selected threshold, the LSB module combined current is combined with the output current from the DAC cells of the MSB cell segment module 414. In some examples, the currents are combined at the output 420. In some implementations, the combined current at the output 420 is then converted back to the voltage domain.

Figure 4C:
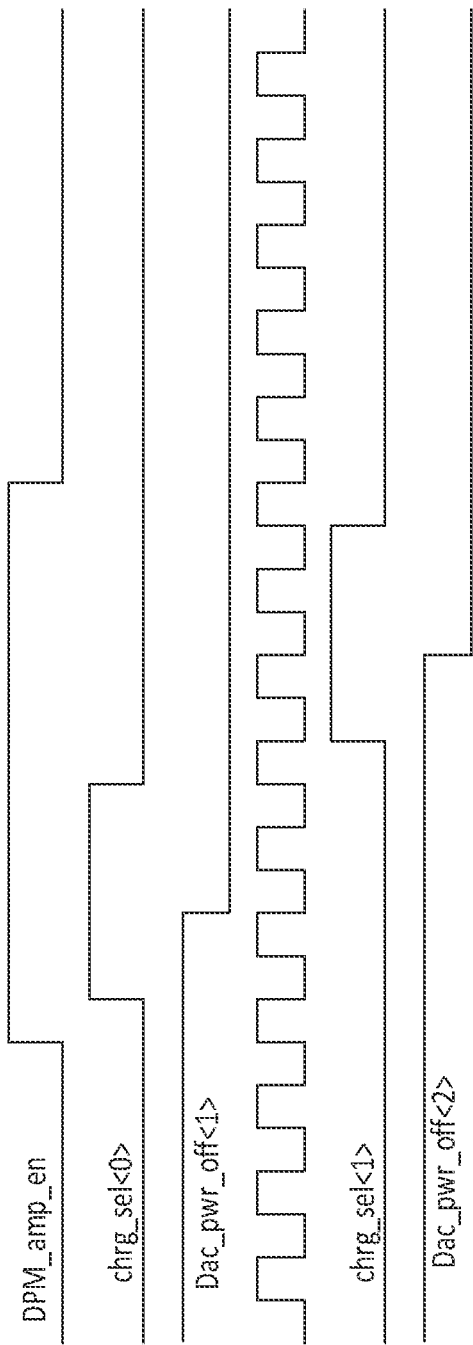

FIGS. 4B and 4C show I-DAC timing for engaging cells and logic structures and deactivating the zero path. In particular, FIG. 4B shows a timing diagram 450 for turning devices off, while FIG. 4C shows a timing diagram 460 for turning devices on. Note the difference in the Dac_pwr_off<1> and Dac_pwr_off<2> bits between the two timing diagrams 450, 460.

The I-DAC timing for engaging cells and logic structures and deactivating the zero path are shown in FIG. 3C.

DAC Splitter Bypass

Figure 5:
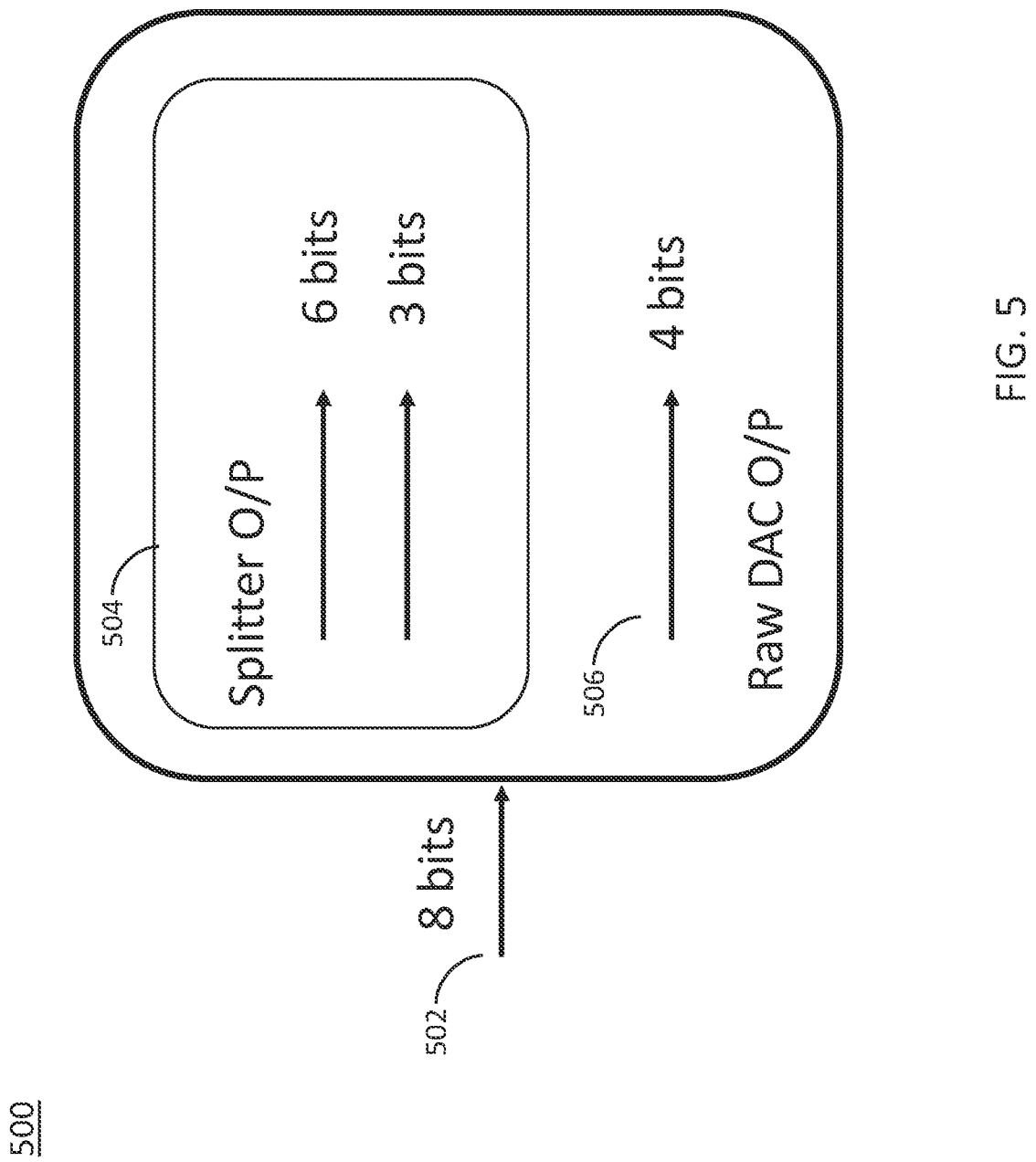
FIG. 5 shows an example of a sample-by-sample bypass splitter, according to various embodiments of the disclosure.

According to various implementations, the 3-level I-DAC 200 is used in a circuit architecture that includes a noise splitter, such as the playback path system architecture 100 shown in FIG. 1. In some examples, the noise splitter is a bypass splitter. FIG. 5 shows an example of a sample-by-sample bypass splitter 500, according to various embodiments of the disclosure. The sample-by-sample bypass splitter 500 receives an 8-bit input signal 502, which can be directed to one of two output lines.

The first output line is a noise splitter output line 504, and the second output line is a raw DAC output line 506. The bypass splitter 500 directs larger signals to the noise splitter output line 504, where the signal are split into a 3 bit signal and a 6 bit signal. The bypass splitter 500 directs small signals to the raw DAC output line 506, where the signals pass directly through the bypass splitter 500, bypassing the noise splitter output line 504.

For a small signal, only the least significant bits (LSBs) of the 8 bit input signal contain information, and these bits are passed through the noise splitter. In particular, the raw DAC output line 506 passes through 4 bits, the 4 least significant bits of the input signal 502. For a large input signal, both the least significant bits and the most significant bits (MSBs) contain information, so large input signals are split at the noise splitter output line 504, which splits the signal into 6 bits and 3 bits, maintaining the input data. The bypass splitter directs the signal either through the noise splitter line 504 or to the raw DAC line 506 on a sample-by-sample basis. In one example, if the signal is less than 3 codes, the raw DAC output line 506 is used, bypassing the noise splitter. If the signal is equal to or more than three codes, the noise splitter line 504 is used. In some examples, a code value is the digital input if the signal is equal to a value of three or more. In some examples, a sigma delta loop is used to split the signal for the noise splitter line 504.

In some implementations, the noise splitter is continuously running, even when it is not being used, so that it is ready when a large signal arrives. At each clock cycle, it is determined whether the data signal goes through the noise splitter or the bypass line. In particular, based on the input at the interpolator 102, it can be determined whether the data signal will go through the noise splitter line 504 or the raw DAC/bypass line 506. In some examples, the MSBs (most significant bits) are gated on the analog side.

According to some implementations, referring back to FIG. 1, the scramblers 110a, 110b, 110c include a dynamic element matching (DEM) module that is connected to the 6-bit data line in the noise splitter 106. In some examples, the DEMs are frozen at a previous state on the digital side. The input to the DEM depends on the data signal received at the bypass splitter.

Referring back to FIG. 4A, when the bypass splitter 500 is bypassing the noise splitting output line 504 and directing small signals to the raw DAC output line 506, the DAC 400 can receive the information that the incoming signal is small and turn off the currents of the cells in the MSB cell segment module 414. Thus, when the bypass splitter 500 enters a low power mode, the DAC 400 can also be put into a low power mode.

DSB and DDP

Figure 6:
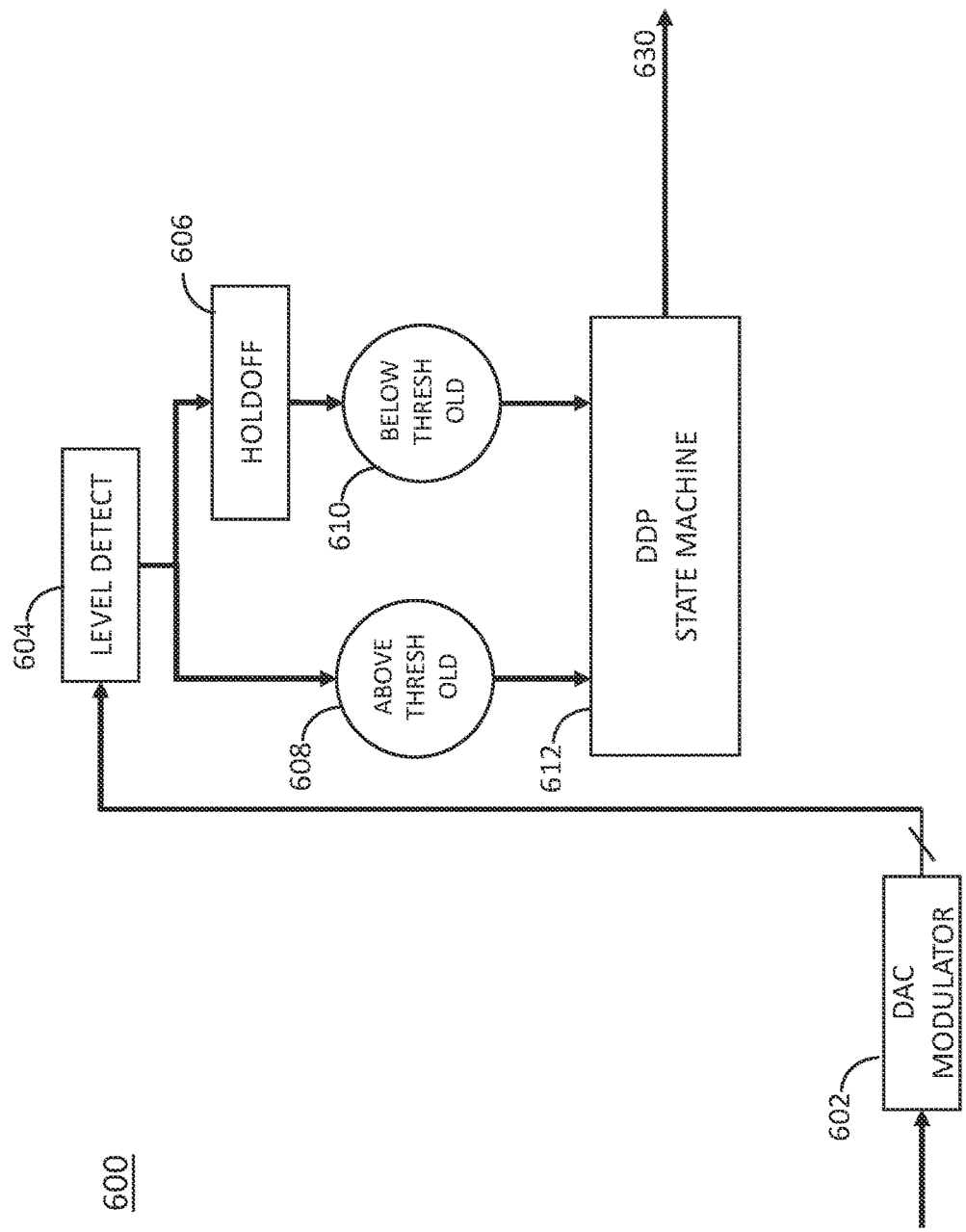
FIG. 6 shows a hold-off (and hold-on) system for a DAC Splitter Bypass (DSB) and a DAC Dynamic Power (DDP) mode, according to various embodiments of the disclosure.

FIG. 6 shows a hold-off (and hold-on) system 600 for a DAC Splitter Bypass (DSB) and a DAC Dynamic Power (DDP) mode, according to various embodiments of the disclosure. The input to the system 600 is to a DAC modulator 602. In some examples, the DAC modulator 602 is similar to the modulator 104 of FIG. 1. The output from the modulator 602 is split into multiple lines. A first line is connected to a level detector 604. The splitter bypass relies on level detection of input. The level detector 604 determines the level of the DAC modulator output. In general, the hold-off (and hold-on) system 600 illustrates a system for determining whether to not use some cells as well as a system for determining whether to power down one or more DAC cells in a DAC MSB cell segment module, such as MSB cell segment module 414 of FIG. 4A.

If the level is above a selected threshold, the signal from the level detector 604 is output to the above threshold module 608, which enables the high stage for the DDP state machine 612 and triggers the unused trip block 614. If the level at the level detector 604 is below a selected threshold, the signal from the level detector 604 is output to a holdoff 606. The holdoff delays disabling the of the high stage for a selected period of time. After the selected period of time, if the level of the signal continues to be below the selected threshold, the signal from the holdoff 606 is output to the below threshold module 610, which disables the high stage. In some examples, disabling the high stage, allows one or more cells in the MSB cell segment module of an upcoming DAC to be powered down. The DDP state machine 612 output instructions regarding power controls to DAC cells. In some examples, disabling the high stage triggers use of the unused trip block 614. The DAC unused trip block 614 can signal the DAC DEM to not use certain DAC cells.

The other lines from the DAC modulator are input to a delay 620, which allows a lookahead for DAC cell power controls. In particular, the delay provides warning of an upcoming large signal, allowing any DAC cells that had been powered down to be powered back up again. The DAC modulator output signals are then input to splitters 622, which can respond to the output from the DSB trigger module 614. The splitters 622 use the bypass enable signal to determine whether the signal can bypass the noise splitting line, using just the least significant bits, as discussed above with respect to FIG. 5. Thus, the splitters 622 output either truncated data or splitter data. The output from the splitters 622 is input to DEM modules 624, and DEM module outputs are input to DACs.

One advantage of the solutions shown herein are that they are lower power, higher performance, robust systems and methods to toggle between modes.

EXAMPLES OF SYSTEM TIMING FOR DDP AND DSB

Figure 7A:
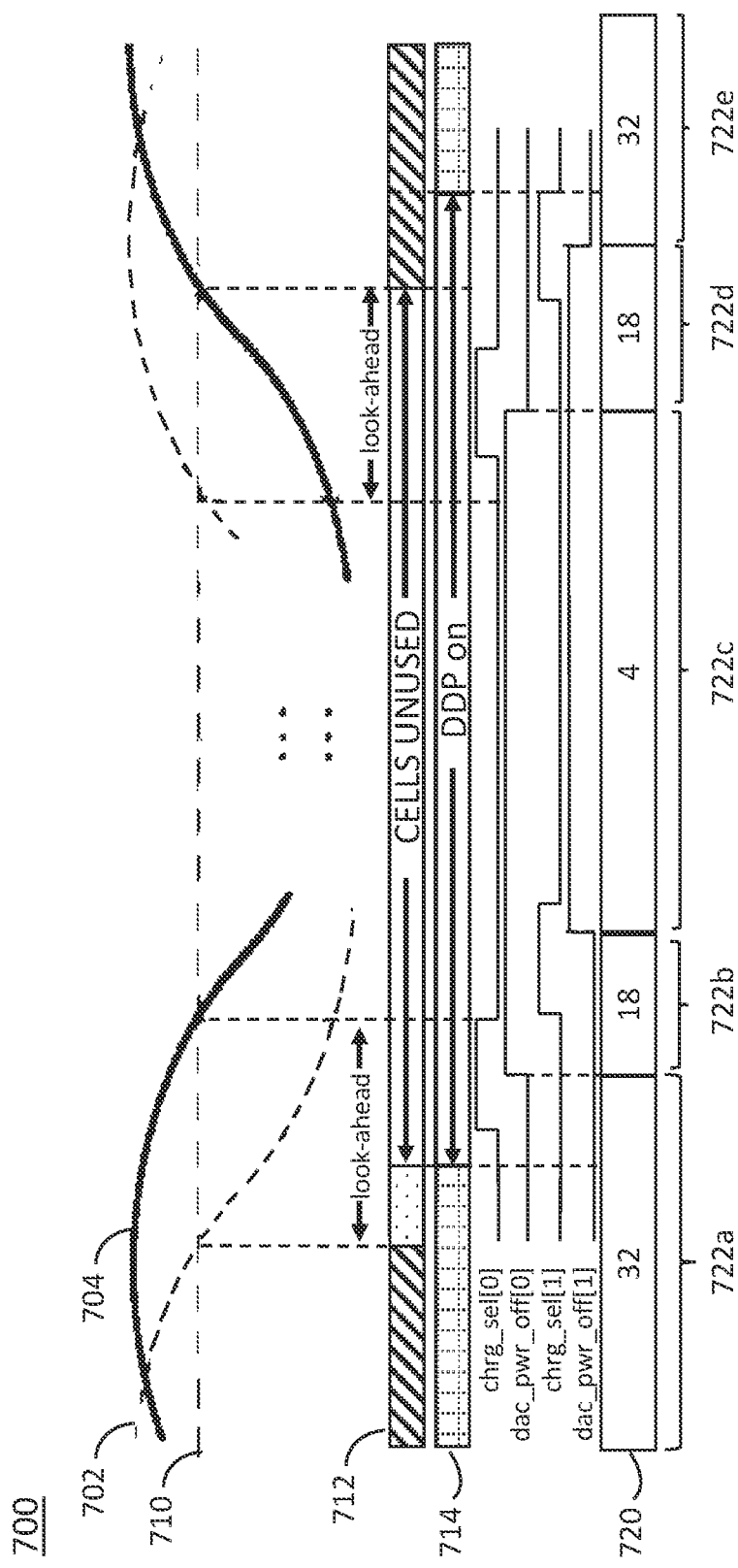
FIGS. 7A-7B show examples of overall timing of the DDP and DSB systems, according to various embodiments of the disclosure.
Figure 7B:
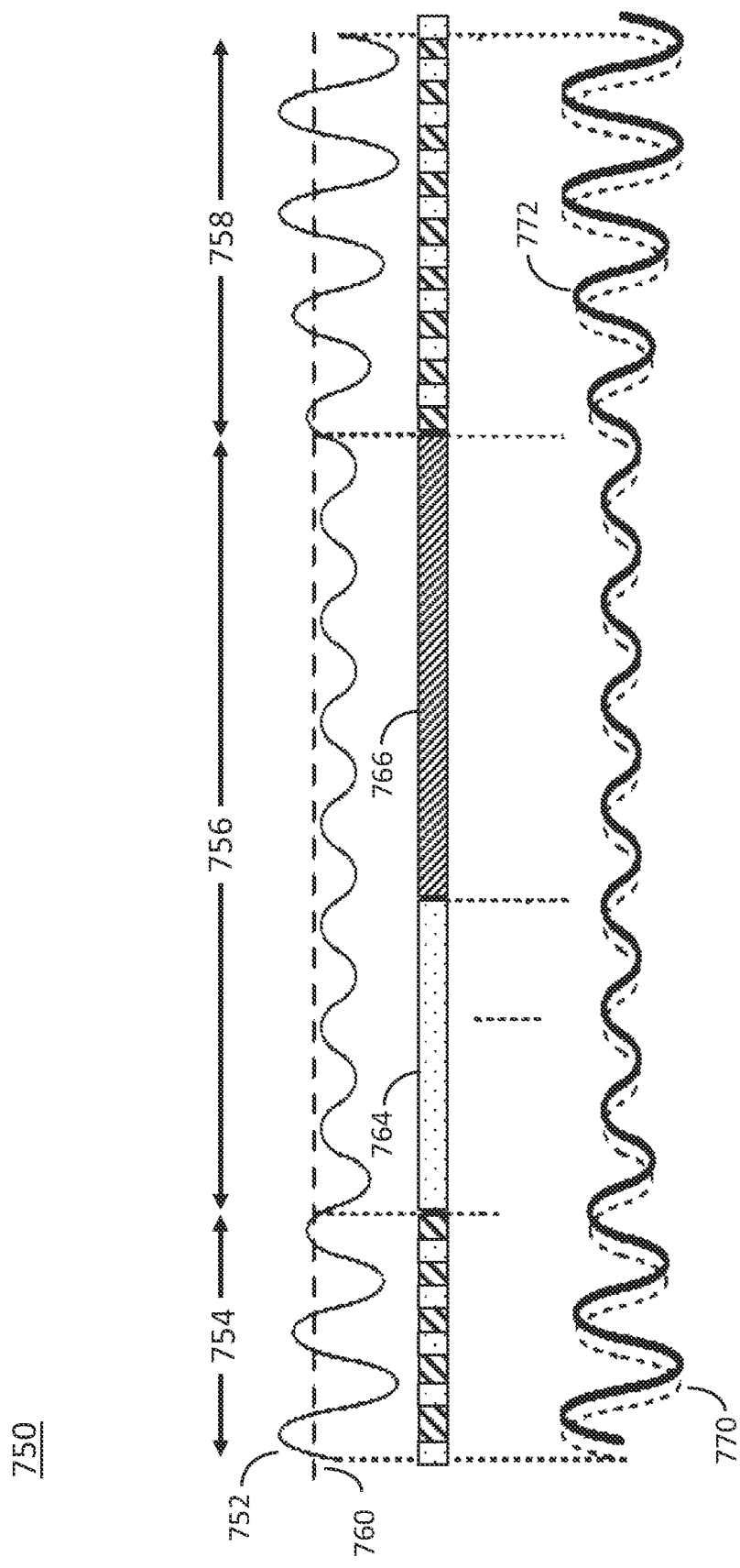

FIGS. 7A-7B show examples of overall timing of the DDP and DSB systems, according to various embodiments of the disclosure. As shown at the top of FIG. 7A, a dashed line 702 represents the input/lookahead signal, and a solid line 704 represents the output/delayed signal. The straight dashed line 710 is the selected threshold, below which a DDP system enters a power saving mode, turning off one or more MSB cell segment module DACs. As shown in timing bar 714, shortly after the input/lookahead signal 702 drops below the threshold 710, DAC Dynamic Power mode is turned on. Similarly, shortly after the input/lookahead signal 702 drops below the threshold 710, the DSB bypass mode is turned on.

The bottom line 720 in FIG. 7A lists the number of DAC cells powered on in a DDP mode system. During a first time period 722a, 32 DAC cells are powered on. Then, a dac_pwr_off[0] signal is turned on, triggering powering off of 14 MSB cell segment module DACs. Thus, during a second time period 722b in the bottom line 720, 18 DAC cells are powered on. Then, a second dac_pwr_off[1] signal is turned on, triggering powering off of 14 more MSB cell segment module DACs. Thus, during a third time period 722c in the bottom line 720, 4 DAC cells are powered on. At the end of the third time period 722c, the dac_pwr_off[0] signal is turned off, and, in the fourth time period 722d, 14 DAC cells are turned back on, resulting in 18 DAC cells being powered on. At the end of the fourth time period 722d, the dac_pwr_off[1] signal is turned off, and, in the fifth time period 722e, 14 more DAC cells are turned back on, resulting in 32 DAC cells being powered on. During the fifth time period 722e, the DDP mode is turned off.

As shown in FIG. 7B, during a first window 754, the incoming data signal 752 is a big signal, greater than a selected threshold 760. Then, during a second window 756, the incoming signal 752 decreases and falls below the selected threshold 760. When the incoming data signal 752 becomes a small signal during the second window 756, the MSB cells are eligible to be disabled. To enter this mode of operation, there is a threshold detector and/or envelope detector that detects whether the splitter is in big signal mode or small signal mode. Then, there is a hold off period 764 to determine whether the incoming signal 752 will remain small and the splitter can remain in small signal (low power) mode, before the MSB cells can be disabled in the period 766. As shown at the bottom of FIG. 7B, there is a look-ahead, as shown by the dashed line 770, to determine if a big signal is coming. The bold line 772 shows the output/delayed signal. As shown in FIG. 7B, there is a large signal coming on the left side of the figure, during the third window 758. The latency can be used to determine when the signal will increase above the threshold 760 and indicate mode switch. In the third window 758, the DAC returns to normal operation. According to various implementations, some unique features are a data-dependent bit start, data dependent segment activation, fast activation abort sequence, and reversal of activation sequence before completion.

One advantage of the solutions shown herein are that they are lower power, higher performance, robust systems and methods to toggle between modes.

Variations and Implementations

Figure 8:
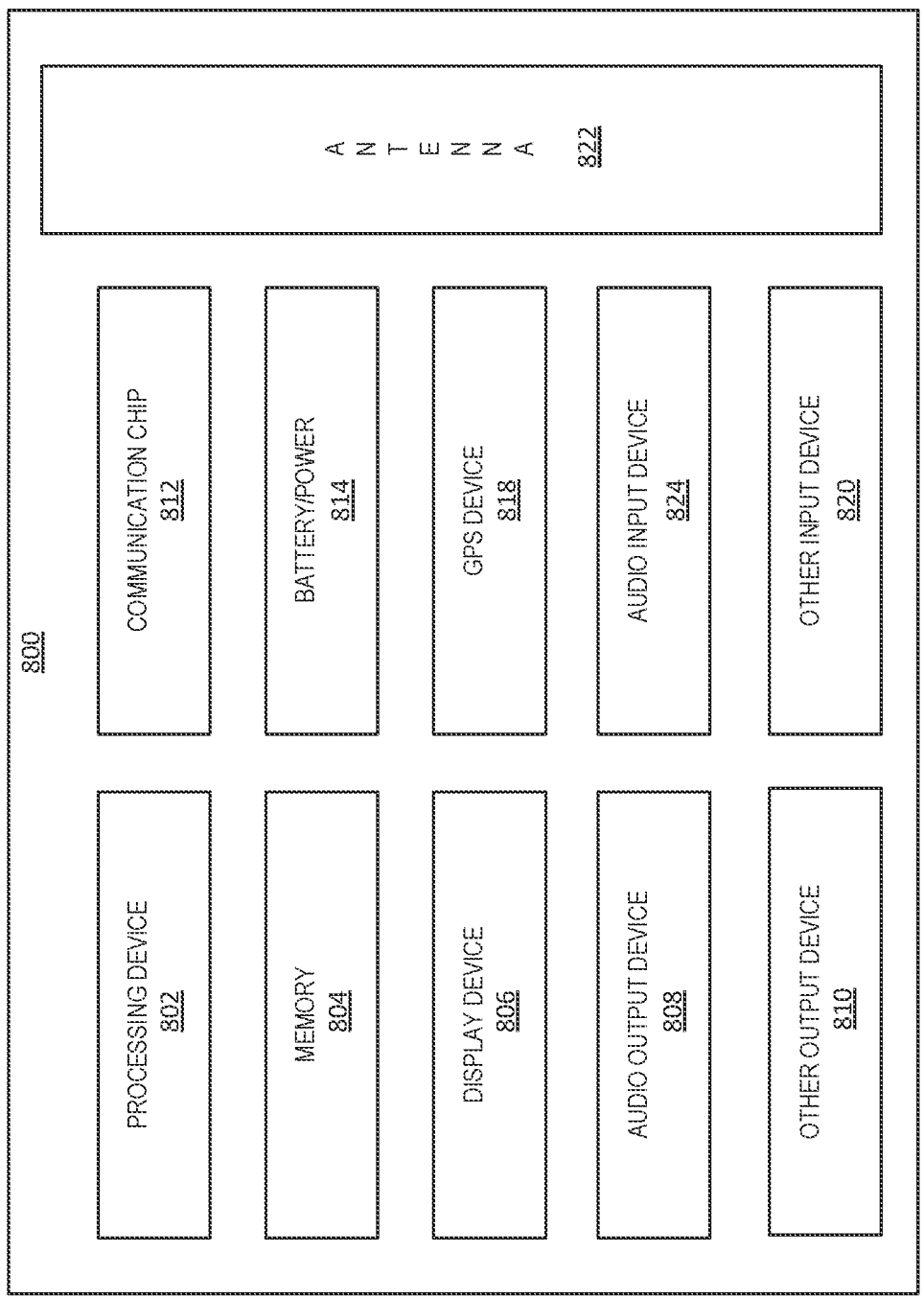
FIG. 8 is a block diagram of an example electrical device 900 that may include one or more class D drivers, according to various embodiments of the disclosure.

FIG. 8 is a block diagram of an example electrical device 800 that may include one or more class D drivers, in accordance with any of the embodiments disclosed herein. A number of components are illustrated in FIG. 8 as included in the electrical device 800, but any one or more of these components may be omitted or duplicated, as suitable for the application. In some embodiments, some or all of the components included in the electrical device 800 may be attached to one or more motherboards. In some embodiments, some or all of these components are fabricated onto a single system-on-a-chip (SoC) die.

Additionally, in various embodiments, the electrical device 800 may not include one or more of the components illustrated in FIG. 8, but the electrical device 800 may include interface circuitry for coupling to the one or more components. For example, the electrical device 800 may not include a display device 806, but may include display device interface circuitry (e.g., a connector and driver circuitry) to which a display device 806 may be coupled. In another set of examples, the electrical device 800 may not include an audio input device 824 or an audio output device 808, but may include audio input or output device interface circuitry (e.g., connectors and supporting circuitry) to which an audio input device 824 or audio output device 808 may be coupled.

The electrical device 800 may include a processing device 802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 800 may include a memory 804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 804 may include memory that shares a die with the processing device 802. This memory may be used as cache memory and may include embedded dynamic random access memory (eDRAM) or spin transfer torque magnetic random access memory (STT-MRAM).

In some embodiments, the electrical device 800 may include a communication chip 812 (e.g., one or more communication chips). For example, the communication chip 812 may be configured for managing wireless communications for the transfer of data to and from the electrical device 800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 812 may operate in accordance with other wireless protocols in other embodiments. The electrical device 800 may include an antenna 822 to facilitate wireless communications and/or to receive other wireless communications (such as AM or FM radio transmissions).

In some embodiments, the communication chip 812 may manage wired communications, such as electrical, optical, or any other suitable communication protocols (e.g., the Ethernet). As noted above, the communication chip 812 may include multiple communication chips. For instance, a first communication chip 812 may be dedicated to shorter-range wireless communications such as Wi-Fi or Bluetooth, and a second communication chip 812 may be dedicated to longer-range wireless communications such as global positioning system (GPS), EDGE, GPRS, CDMA, WiMAX, LTE, EV-DO, or others. In some embodiments, a first communication chip 812 may be dedicated to wireless communications, and a second communication chip 812 may be dedicated to wired communications.

The electrical device 800 may include battery/power circuitry 814. The battery/power circuitry 814 may include one or more energy storage devices (e.g., batteries or capacitors) and/or circuitry for coupling components of the electrical device 800 to an energy source separate from the electrical device 800 (e.g., AC line power).

The electrical device 800 may include a display device 806 (or corresponding interface circuitry, as discussed above). The display device 806 may include any visual indicators, such as a heads-up display, a computer monitor, a projector, a touchscreen display, a liquid crystal display (LCD), a light-emitting diode display, or a flat panel display.

The electrical device 800 may include an audio output device 808 (or corresponding interface circuitry, as discussed above). The audio output device 808 may include any device that generates an audible indicator, such as speakers, headsets, or earbuds.

The electrical device 800 may include an audio input device 824 (or corresponding interface circuitry, as discussed above). The audio input device 824 may include any device that generates a signal representative of a sound, such as microphones, microphone arrays, or digital instruments (e.g., instruments having a musical instrument digital interface (MIDI) output).

The electrical device 800 may include a GPS device 810 (or corresponding interface circuitry, as discussed above). The GPS device 810 may be in communication with a satellite-based system and may receive a location of the electrical device 800, as known in the art.

The electrical device 800 may include another output device 810 (or corresponding interface circuitry, as discussed above). Examples of the other output device 810 may include an audio codec, a video codec, a printer, a wired or wireless transmitter for providing information to other devices, or an additional storage device.

The electrical device 800 may include another input device 820 (or corresponding interface circuitry, as discussed above). Examples of the other input device 820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 800 may be any other electronic device that processes data.

SELECT EXAMPLES

Example 1 provides a 3-level digital-to-analog converter (DAC), comprising: a plurality of current sources each having a current flow, wherein the plurality of current sources includes a first subset of current sources and a second subset of current sources; a first positive current path for the first subset of current sources, wherein the first positive current path includes a first switch; a first negative current path for the first subset of current sources, wherein the first positive current path includes a second switch; a zero-state current path for a first portion of the first subset of current sources, wherein the zero-state current path is a dump path, and wherein the zero-state current path includes a third switch; and a bypass current path for a second portion of the first subset of current sources, wherein the zero-state current path includes a fourth switch, wherein the fourth switch is closed when the third switch is closed, and wherein the bypass current path is configured to shunt the second portion of current sources from the dump path, thereby keeping the DAC powered on.

Example 2 provides a converter according to any of the preceding and/or following examples, further comprising a second positive current path for the second subset of current sources, wherein the second positive current path includes a fifth switch, and wherein the fifth switch is closed when the first switch is closed.

Example 3 provides a converter according to any of the preceding and/or following examples, further comprising a positive output, wherein the positive output includes a first positive current path output and a second positive current path output.

Example 4 provides a converter according to any of the preceding and/or following examples, further comprising a second negative current path for the second subset of current sources, wherein the second negative current path includes a sixth switch, and wherein the sixth switch is closed when the second switch is closed.

Example 5 provides a converter according to any of the preceding and/or following examples, further comprising a negative output, wherein the negative output includes a first negative current path output and a second negative current path output.

Example 6 provides a converter according to any of the preceding and/or following examples, further comprising a zero-state current path for the second subset of current sources, wherein the second zero-state current path includes a seventh switch, and wherein the seventh switch is closed when the third switch is closed.

Example 7 provides a converter according to any of the preceding and/or following examples, wherein the plurality of current sources include outputs from a discrete element model module.

Example 8 provides a system for converting a digital signal to an analog signal, comprising an input signal; a first plurality of digital-to-analog converter (DAC) cells coupled to the input signal, wherein the first plurality of DAC cells remain powered on; a second plurality of DAC cells, wherein ones of the second plurality of DAC cells are configured to be powered down when the input signal is below a selected threshold; a charge amplifier configured to provide charge to powered down DAC cells of the second plurality of DAC cells; and a multiplexor, coupled to the charge amplifier and the second plurality of DAC cells, wherein, when the input signal rises above the selected threshold, the multiplexor is configured to connect the charge amplifier charge to powered down DAC cells of the second plurality of DAC cells, wherein the charge amplifier charge powers up the powered down DAC cells of the second plurality of DAC cells.

Example 9 provides a system according to any of the preceding and/or following examples, further comprising a look-ahead element for determining when the input signal will rise above the selected threshold.

Example 10 provides a system according to any of the preceding and/or following examples, further comprising a filter coupled to the first plurality of DAC cells, wherein the multiplexor is further coupled to the filter.

Example 11 provides a system according to any of the preceding and/or following examples, wherein a multiplexor input is one of the charge amplifier charge and a filter output.

In the preceding discussion, reference may be made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the preceding detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an application specific integrated circuit (ASIC), an electronic circuit, a processor (shared, dedicated, or group) or memory (shared, dedicated, or group) that execute one or more software or firmware programs, a combinational logic circuit, or other suitable components that provide the described functionality.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein.

Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The foregoing outlines features of one or more embodiments of the subject matter disclosed herein. These embodiments are provided to enable a person having ordinary skill in the art (PHOSITA) to better understand various aspects of the present disclosure. Certain well-understood terms, as well as underlying technologies and/or standards may be referenced without being described in detail. It is anticipated that the PHOSITA will possess or have access to background knowledge or information in those technologies and standards sufficient to practice the teachings of the present disclosure.

The PHOSITA will appreciate that they may readily use the present disclosure as a basis for designing or modifying other processes, structures, or variations for carrying out the same purposes and/or achieving the same advantages of the embodiments introduced herein. The PHOSITA will also recognize that such equivalent constructions do not depart from the spirit and scope of the present disclosure, and that they may make various changes, substitutions, and alterations herein without departing from the spirit and scope of the present disclosure.

The above-described embodiments may be implemented in any of numerous ways. One or more aspects and embodiments of the present application involving the performance of processes or methods may utilize program instructions executable by a device (e.g., a computer, a processor, or other device) to perform, or control performance of, the processes or methods.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above.

The computer readable medium or media may be transportable, such that the program or programs stored thereon may be loaded onto one or more different computers or other processors to implement various ones of the aspects described above. In some embodiments, computer readable media may be non-transitory media.

Note that the activities discussed above with reference to the FIGURES which are applicable to any integrated circuit that involves signal processing (for example, gesture signal processing, video signal processing, audio signal processing, analog-to-digital conversion, digital-to-analog conversion), particularly those that can execute specialized software programs or algorithms, some of which may be associated with processing digitized real-time data.

In some cases, the teachings of the present disclosure may be encoded into one or more tangible, non-transitory computer-readable mediums having stored thereon executable instructions that, when executed, instruct a programmable device (such as a processor or DSP) to perform the methods or functions disclosed herein. In cases where the teachings herein are embodied at least partly in a hardware device (such as an ASIC, IP block, or SoC), a non-transitory medium could include a hardware device hardware-programmed with logic to perform the methods or functions disclosed herein. The teachings could also be practiced in the form of Register Transfer Level (RTL) or other hardware description language such as VHDL or Verilog, which can be used to program a fabrication process to produce the hardware elements disclosed.

In example implementations, at least some portions of the processing activities outlined herein may also be implemented in software. In some embodiments, one or more of these features may be implemented in hardware provided external to the elements of the disclosed figures, or consolidated in any appropriate manner to achieve the intended functionality. The various components may include software (or reciprocating software) that can coordinate in order to achieve the operations as outlined herein. In still other embodiments, these elements may include any suitable algorithms, hardware, software, components, modules, interfaces, or objects that facilitate the operations thereof.

Any suitably-configured processor component can execute any type of instructions associated with the data to achieve the operations detailed herein. Any processor disclosed herein could transform an element or an article (for example, data) from one state or thing to another state or thing. In another example, some activities outlined herein may be implemented with fixed logic or programmable logic (for example, software and/or computer instructions executed by a processor) and the elements identified herein could be some type of a programmable processor, programmable digital logic (for example, an FPGA, an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof.

In operation, processors may store information in any suitable type of non-transitory storage medium (for example, random access memory (RAM), read only memory (ROM), FPGA, EPROM, electrically erasable programmable ROM (EEPROM), etc.), software, hardware, or in any other suitable component, device, element, or object where appropriate and based on particular needs. Further, the information being tracked, sent, received, or stored in a processor could be provided in any database, register, table, cache, queue, control list, or storage structure, based on particular needs and implementations, all of which could be referenced in any suitable timeframe.

Any of the memory items discussed herein should be construed as being encompassed within the broad term 'memory.' Similarly, any of the potential processing elements, modules, and machines described herein should be construed as being encompassed within the broad term 'microprocessor' or 'processor.' Furthermore, in various embodiments, the processors, memories, network cards, buses, storage devices, related peripherals, and other hardware elements described herein may be realized by a processor, memory, and other related devices configured by software or firmware to emulate or virtualize the functions of those hardware elements.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a personal digital assistant (PDA), a smart phone, a mobile phone, an iPad, or any other suitable portable or fixed electronic device.

Also, a computer may have one or more input and output devices. These devices can be used, among other things, to present a user interface. Examples of output devices that may be used to provide a user interface include printers or display screens for visual presentation of output and speakers or other sound generating devices for audible presentation of output. Examples of input devices that may be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks or wired networks.

Computer-executable instructions may be in many forms, such as program modules, executed by one or more computers or other devices. Generally, program modules include routines, programs, objects, components, data structures, etc. that performs particular tasks or implement particular abstract data types. Typically, the functionality of the program modules may be combined or distributed as desired in various embodiments.

The terms "program" or "software" are used herein in a generic sense to refer to any type of computer code or set of computer-executable instructions that may be employed to program a computer or other processor to implement various aspects as described above. Additionally, it should be appreciated that according to one aspect, one or more computer programs that when executed perform methods of the present application need not reside on a single computer or processor, but may be distributed in a modular fashion among a number of different computers or processors to implement various aspects of the present application.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code may be executed on any suitable processor or collection of processors, whether provided in a single computer or distributed among multiple computers.

Computer program logic implementing all or part of the functionality described herein is embodied in various forms, including, but in no way limited to, a source code form, a computer executable form, a hardware description form, and various intermediate forms (for example, mask works, or forms generated by an assembler, compiler, linker, or locator). In an example, source code includes a series of computer program instructions implemented in various programming languages, such as an object code, an assembly language, or a high-level language such as OpenCL, RTL, Verilog, VHDL, Fortran, C, C++, JAVA, or HTML for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

In some embodiments, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc.

Other components such as external storage, additional sensors, controllers for audio/video display, and peripheral devices may be attached to the board as plug-in cards, via cables, or integrated into the board itself. In another example embodiment, the electrical circuits of the FIGURES may be implemented as standalone modules (e.g., a device with associated components and circuitry configured to perform a specific application or function) or implemented as plug-in modules into application-specific hardware of electronic devices.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this disclosure.

In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Interpretation of Terms

All definitions, as defined and used herein, should be understood to control over dictionary definitions, definitions in documents incorporated by reference, and/or ordinary meanings of the defined terms. Unless the context clearly requires otherwise, throughout the description and the claims:

"comprise," "comprising," and the like are to be construed in an inclusive sense, as opposed to an exclusive or exhaustive sense; that is to say, in the sense of "including, but not limited to".

"connected," "coupled," or any variant thereof, means any connection or coupling, either direct or indirect, between two or more elements; the coupling or connection between the elements can be physical, logical, or a combination thereof.

"herein," "above," "below," and words of similar import, when used to describe this specification shall refer to this specification as a whole and not to any particular portions of this specification.

"or," in reference to a list of two or more items, covers all of the following interpretations of the word: any of the items in the list, all of the items in the list, and any combination of the items in the list.

the singular forms "a", "an" and "the" also include the meaning of any appropriate plural forms.

Words that indicate directions such as "vertical", "transverse", "horizontal", "upward", "downward", "forward", "backward", "inward", "outward", "vertical", "transverse", "left", "right", "front", "back", "top", "bottom", "below", "above", "under", and the like, used in this description and any accompanying claims (where present) depend on the specific orientation of the apparatus described and illustrated. The subject matter described herein may assume various alternative orientations. Accordingly, these directional terms are not strictly defined and should not be interpreted narrowly.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined.

Elements other than those specifically identified by the "and/or" clause may optionally be present, whether related or unrelated to those elements specifically identified. Thus, as a non-limiting example, a reference to "A and/or B", when used in conjunction with open-ended language such as "comprising" may refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

As used herein, the term "between" is to be inclusive unless indicated otherwise. For example, "between A and B" includes A and B unless indicated otherwise.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke 35 U.S.C. § 112(f) as it exists on the date of the filing hereof unless the words "means for" or "steps for" are specifically used in the particular claims; and (b) does not intend, by any statement in the disclosure, to limit this disclosure in any way that is not otherwise reflected in the appended claims.

The present invention should therefore not be considered limited to the particular embodiments described above. Various modifications, equivalent processes, as well as numerous structures to which the present invention may be applicable, will be readily apparent to those skilled in the art to which the present invention is directed upon review of the present disclosure.

What is claimed is:

1. A 3-level digital-to-analog converter (DAC), comprising:
    a plurality of current sources each having a current flow, wherein the plurality of current sources includes a first subset of current sources and a second subset of current sources;
    a first positive current path for the first subset of current sources, wherein the first positive current path includes a first switch;
    a first negative current path for the first subset of current sources, wherein the first negative current path includes a second switch;
    a zero-state current path for a first portion of the first subset of current sources, wherein the zero-state current path is a dump path, and wherein the zero-state current path includes a third switch; and
    a bypass current path for a second portion of the first subset of current sources, wherein the zero-state current path includes a fourth switch, wherein the fourth switch is closed when the third switch is closed, and wherein the bypass current path is configured to shunt the second portion of the first subset of current sources from the dump path, thereby keeping the DAC powered on.

2. The DAC of claim 1, further comprising a second positive current path for the second subset of current sources, wherein the second positive current path includes a fifth switch, and wherein the fifth switch is closed when the first switch is closed.

3. The DAC of claim 2, further comprising a positive output, wherein the positive output includes a first positive current path output and a second positive current path output.

4. The DAC of claim 1, further comprising a second negative current path for the second subset of current sources, wherein the second negative current path includes a sixth switch, and wherein the sixth switch is closed when the second switch is closed.

5. The DAC of claim 3, further comprising a negative output, wherein the negative output includes a first negative current path output and a second negative current path output.

6. The DAC of claim 1, further comprising a zero-state current path for the second subset of current sources, wherein the second zero-state current path includes a seventh switch, and wherein the seventh switch is closed when the third switch is closed.

7. The DAC of claim 1, wherein the plurality of current sources include outputs from a discrete element model module.

8. The DAC of claim 1, further comprising a plurality of transistors, wherein each of the plurality of transistors is coupled to a respective current source of the plurality of current sources, and wherein each of the plurality of transistors is configured to turn on the respective current source and turn off the respective current source.

9. The DAC of claim 8, wherein the plurality of transistors is configured to turn on and off respective current sources by regulating respective gate voltages.

10. The DAC of claim 1, wherein at least one of the first positive current path and the first negative current path is configured to switch directions.

11. The DAC of claim 1, further comprising a charge amplifier coupled to the second portion of the first subset of current sources, wherein the charge amplifier provides extra charge to the second portion of the first subset of current sources, and wherein the charge amplifier is turned on for a selected period of time.

12. A system for converting a digital signal to an analog signal, comprising
    an input signal;
    a first plurality of digital-to-analog converter (DAC) cells coupled to the input signal, wherein the first plurality of DAC cells remain powered on;
    a second plurality of DAC cells, wherein ones of the second plurality of DAC cells are configured to be powered down when the input signal is below a selected threshold;
    a charge amplifier configured to provide charge to powered down DAC cells of the second plurality of DAC cells; and
    a multiplexor, coupled to the charge amplifier and the second plurality of DAC cells, wherein, when the input signal rises above the selected threshold, the multiplexor is configured to connect the charge amplifier charge to powered down DAC cells of the second plurality of DAC cells, wherein the charge amplifier charge powers up the powered down DAC cells of the second plurality of DAC cells.

13. The system of claim 12, further comprising a look-ahead element for determining when the input signal will rise above the selected threshold.

14. The system of claim 12, further comprising a filter coupled to the first plurality of DAC cells, wherein the multiplexor is further coupled to the filter.

15. The system of claim 14, wherein a multiplexor input is one of the charge amplifier charge and a filter output.

16. A method for digital-to-analog conversion, comprising:

receiving a plurality of input current flows, wherein the plurality of input current flows includes a first subset of input current flows and a second subset of input current flows; and selecting one of a plurality of current paths, wherein:
   selecting a first positive current path of the plurality of current paths comprises closing a first switch;
   selecting a first negative current path of the plurality of current paths comprises closing a second switch;
   selecting a zero-state current path of the plurality of current paths comprises: closing a third switch causing a first portion of the first subset of input current flows to follow a dump path, and closing a fourth switch shunting a second portion of the first subset of input current flows from the dump path, thereby keeping the DAC powered on.

17. The method of claim 16, wherein selecting the zero-state current path further comprises turning off the second portion of the first subset of input current flows.

18. The method of claim 16, further comprising triggering turning on of the second portion of the first subset of input current flows based on an input signal state.

19. The method of claim 16, wherein selecting a first positive current path further comprises selecting a second positive current path by closing a fifth switch.

20. The method of claim 16, wherein selecting a first negative current path further comprises selecting a second negative current path by closing a sixth switch.

* * * * *